US011631962B2

(12) United States Patent
Chen

(10) Patent No.: US 11,631,962 B2
(45) Date of Patent: Apr. 18, 2023

(54) LIGHT SOURCE WITH INTEGRATED MONITOR PHOTODETECTOR AND DIFFUSER

(71) Applicant: FINISAR CORPORATION, Sunnyvale, CA (US)

(72) Inventor: Hao Chen, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 153 days.

(21) Appl. No.: 16/870,542

(22) Filed: May 8, 2020

(65) Prior Publication Data

US 2020/0366051 A1    Nov. 19, 2020

Related U.S. Application Data

(60) Provisional application No. 62/847,086, filed on May 13, 2019.

(51) Int. Cl.
  *H01S 5/026* (2006.01)
  *H01S 5/183* (2006.01)
  *H01S 5/42* (2006.01)

(52) U.S. Cl.
  CPC ........ *H01S 5/0264* (2013.01); *H01S 5/18305* (2013.01); *H01S 5/18361* (2013.01); *H01S 5/18391* (2013.01); *H01S 5/423* (2013.01)

(58) Field of Classification Search
  CPC ............... H01S 5/0264; H01S 5/18305; H01S 5/18361; H01S 5/18391; H01S 5/423; H01S 5/0683
  See application file for complete search history.

(56) References Cited

U.S. PATENT DOCUMENTS

| 5,986,996 | A | * | 11/1999 | Kitamura | ............. | G11B 7/0037 |
| 2006/0039434 | A1 | * | 2/2006 | Coleman | ............... | H01S 5/0264 |
| | | | | | | 372/50.1 |
| 2018/0184053 | A1 | * | 6/2018 | Engelen | ................. | H04N 5/217 |
| 2019/0268068 | A1 | * | 8/2019 | Dacha | ..................... | H01S 5/005 |
| 2020/0166768 | A1 | * | 5/2020 | Yoneda | .................... | H01S 5/423 |

FOREIGN PATENT DOCUMENTS

WO    WO-2018053378 A1 *  3/2018  ......... H01L 25/0753

* cited by examiner

*Primary Examiner* — Yuanda Zhang
(74) *Attorney, Agent, or Firm* — Blank Rome LLP

(57) ABSTRACT

A light source includes a substrate with a first surface and an opposite second surface. An epitaxial layer is positioned on the first surface of the substrate. The light source also includes at least one light generator in the epitaxial layer positioned such that an optical signal transmitted thereby is directed toward the substrate. A diffuser is positioned on the second surface of the substrate, and at least one monitor photodetector is positioned in the epitaxial layer in an arrangement configured to receive a portion of the optical signal which is reflected by the diffuser. In one form, the light generator may include a vertical cavity surface emitting laser (VCSEL).

18 Claims, 8 Drawing Sheets

LIGHT SOURCE WITH INTEGRATED MONITOR PHOTODETECTOR AND DIFFUSER

CROSS REFERENCE TO RELATED APPLICATIONS

This application claims priority to U.S. Provisional Patent Application No. 62/847,086 filed May 13, 2019, the contents of which are incorporated herein by reference in their entirety.

FIELD

The present disclosure generally relates to light sources which may, for example, produce a laser. More particularly, but not exclusively, the present disclosure relates to a light source which may include a vertical cavity surface emitting laser (VCSEL) and an integrated monitor photodetector and diffuser.

BACKGROUND

Unless otherwise indicated herein, the materials described herein are not prior art to the claims in the present application and are not admitted to be prior art by inclusion in this section.

Light sources which produce lasers may be used in many different applications, ranging from communication components for data transmission to 3D sensing technologies. One type of laser that is used in optical data transmission and 3D sensing is a vertical cavity surface emitting laser (VCSEL). As its name implies, a VCSEL has a laser cavity that is sandwiched between and defined by two mirror stacks. A VCSEL may be constructed on a semiconductor wafer which may include a Gallium Arsenide (GaAs) substrate. The VCSEL includes a bottom mirror constructed on the semiconductor wafer. Typically, the bottom mirror includes a number of refraction layers of alternating high and low indices of refraction. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., one p-type mirror and one n-type mirror). Notably, the notion of top and bottom mirrors can be somewhat arbitrary. In some configurations, light could be extracted through the substrate from the wafer side of the VCSEL, with the "top" mirror being totally reflective—and thus opaque, which are referred to as bottom emitting VCSELs. Other VCSELs can be top emitting or emitting opposite and away from the substrate and wafer. As used herein, the "top" mirror refers to the mirror that is opposite of the substrate and that reflects the light, the middle is the active region, and the "bottom" refers to the substrate side of the active region that has the substrate from which light is to be extracted, regardless of how it is disposed in the physical structure.

Some illumination functions benefit from a light source that is substantially uniform in its profile. For example, a user may want to engineer the profile to be 30 degrees divergent in the horizontal direction and 50 degrees in the vertical direction so a rectangular area is illuminated in the far field. Light sources implemented in such illumination functions may include a diffuser or an engineered diffuser. The diffuser may control divergence of the profile of the light source. However, in these light sources the diffuser or the engineered diffuser is included in a package at some distance away from an optical source. Accordingly, including the diffusers in these light sources involves package-level integration and costs associated with the package integration.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one embodiment, a light source includes a substrate with a first surface and an opposite second surface. An epitaxial layer is positioned on the first surface of the substrate. The light source also includes at least one light generator in the epitaxial layer positioned such that an optical signal transmitted is directed toward the substrate. A diffuser is positioned on the second surface of the substrate, and at least one monitor photodetector in the epitaxial layer is positioned to receive a portion of the optical signal which is reflected by the diffuser.

In another embodiment, a system includes a light source which includes a substrate including a first surface and an opposite second surface; an epitaxial layer positioned on the first surface of the substrate; at least one light generator in the epitaxial layer positioned such that an optical signal transmitted thereby is directed toward the substrate; a diffuser positioned on the second surface of the substrate; and at least one monitor photodetector in the epitaxial layer positioned to receive a reflected optical signal which is reflected by the diffuser. The system also includes a controller operably coupled with the at least one light generator and the at least one monitor photodetector. The controller is structured to control operation of the at least one light generator based on the reflected optical signal received by the at least one monitor photodetector.

In yet another embodiment, a method of preparing a light source includes providing a substrate having a first surface and a second surface positioned opposite of the first surface; forming an epitaxial layer on the first surface of the substrate; forming at least one light generator in the epitaxial layer; forming at least one monitor photodetector in the epitaxial layer; and forming a diffuser on the second surface of the substrate.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1:
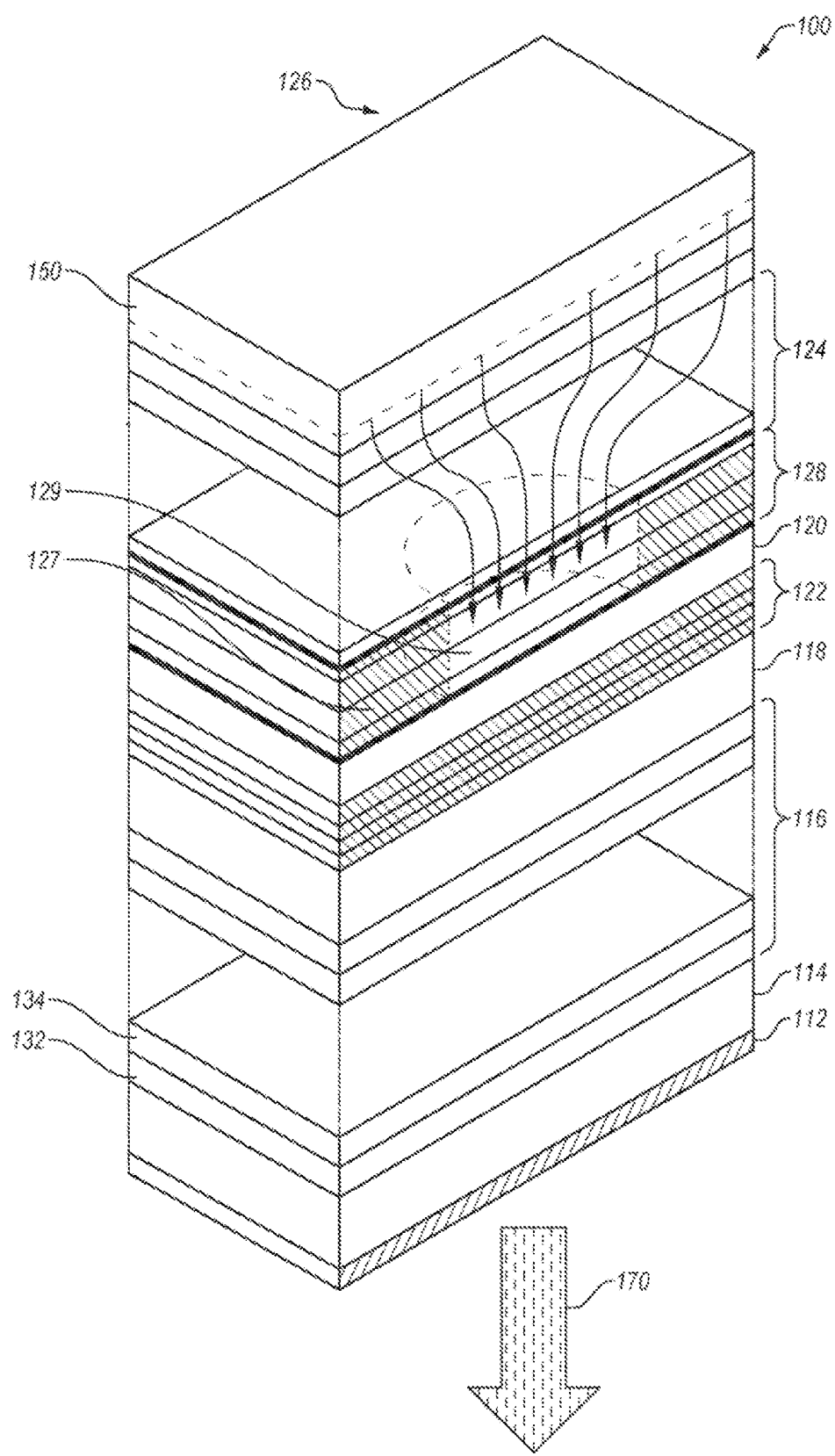
FIG. 1 is a schematic illustration of a vertical cavity surface emitting laser (VCSEL)

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

The present disclosure generally relates to light sources which may, for example, produce or provide a laser. More particularly, but not exclusively, the present disclosure relates to light sources which may include a vertical cavity surface emitting laser (VCSEL) and an integrated monitor photodetector and diffuser. Despite various embodiments being described in the context presented herein, the embodiments disclosed herein may be employed in other fields or operating environments where the functionality disclosed herein may be useful. Accordingly, the scope of the invention should not be construed to be limited to the example implementations and operating environments disclosed herein.

In one aspect, a light source includes a bottom emitting configuration that includes a light generator region having a middle active region bound by a top mirror and bottom mirror. The light generator region can have a contact layer at the top end of the top mirror, where the contact layer has a reflecting region that reflects the light toward the bottom emitter end. The bottom emitting configuration may include a VCSEL as the light generator and may be considered to be a substrate emitter due to the light being emitted through the substrate that is typically considered the bottom of the VCSEL. The light source may include a diffuser integrated with the substrate. For example, the diffuser may be integrated with the bottom side of the substrate opposite of the light generator. The light source may also include a monitor photodetector that is integrated with the same substrate having the light generator and diffuser integrated therewith so as to monitor light reflected from the diffuser. As such, the light source can be configured to include the monitor photodetector and light generator on the top surface of the substrate, and the diffuser is on the bottom surface of the substrate.

In one aspect, the light generator, diffuser, and monitor photodetector can be considered to be an integrated package. The light generator and monitor photodetector can be prepared from layered semiconductor materials, which may for example be in a semiconductor epitaxial structure. The substrate may also be formed from a semiconductor epitaxial structure. The diffuser can be etched into the substrate, or it may be configured as an optically transmissive material, such as a glass or polymer material, that is integrated with the bottom surface of the substrate. The light generator and monitor photodetector can be substantially similar in semiconductor epitaxial structure, but with the monitor photodetector having a reversed bias. In one form, the light source may include an array of two or more light generators (e.g., individual VCSELs) with at least one, two, or more monitor photodetectors on the top side of the substrate and at least one diffuser on the bottom side of the substrate.

The light sources described herein may include a number of different types of semiconductor materials. Examples of suitable materials include III-V semiconductor materials (e.g., prepared from one or more Group III materials (boron (B), aluminum (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup)) and optionally some type IV materials.

The light sources may include the light generator and monitor photodetector having an active region having one or more quantum wells and optionally one or more quantum well barriers between adjacent quantum wells. The quantum wells and quantum well barriers can be separated by one or more transitional layers therebetween. The transitional layers may also be referred to as interfacial layers as they are located at the interface between the quantum wells and quantum well barriers. However, other variations are possible.

Electrical confining layers may optionally sandwich the active region and provide optical gain efficiency by confining carriers to the active region. The confining layers can have a region of high energy band gap which in the case of many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and increases the efficiency in the active region. In an exemplary embodiment, the high aluminum region may also include an increase in doping. The confining layer can be doped with a p-type or n-type dopant depending on whether the confinement barrier is on the n-side or p-side of the active region.

Referring now to FIG. 1, one non-limiting configuration of a bottom emitting VCSEL 100 includes periodic layer pairs for a top mirror stack 124 and a bottom mirror stack 116. The VCSEL 100 includes an isolation region 128 adjacent to the top mirror stack 124. Forms in which an isolation region is additionally or alternatively present adjacent to the bottom mirror stack 116 are possible, as well as forms where no isolation regions are present adjacent to the top mirror stack 124 and the bottom mirror stack 116.

The VCSEL 100 includes a substrate 114 which may be doped with an impurity such as a p-type dopant or an n-type dopant. A diffuser 112 is integrated with a bottom surface of the substrate 114 and the bottom mirror stack 116 is formed on an opposite side of the substrate 114. The VCSEL 100 includes a bottom confining layer 118 formed on the bottom mirror stack 116, although forms where the bottom confining layer 118 is not present are possible. An active region 122 is formed over the bottom confining layer 118, although the active region 122 may be formed over the bottom mirror stack 116 when the bottom confining layer 118 is not present. A top confining layer 120 is formed over the active region 122, although forms where the top confining layer 120 is not present are possible. In the illustrated form, the active region 122 may be considered to be sandwiched between the bottom confining layer 118 and the top confining layer 120.

The isolation region 128 is formed over the top confining layer 120, but may be formed over the active region 122 in forms where the top confining layer 120 is not present. In addition, an isolation region may be positioned under the active region 122 when the bottom confining layer 118 is not present, or under the bottom confining layer 118 when it is present. The isolation region 128 includes a lateral blocking region 127 and a central conductive channel region 129. The bottom confining layer 118, the top confining layer 120, or both the bottom confining layer 118 and the top confining layer 120 may be a spacer region between the active region 122 and the isolation region 128. Alternatively, the bottom confining layer 118, the top confining layer 120, or both the bottom confining layer 118 and the top confining layer 120 may be a conductive region. Thus, any spacer region bounding the active region 122 may be a confining region, conductive region, or semiconductor spacer that is not confining or conducting. The top mirror stack 124 is formed over the isolation region 128. A metal contact layer 126 forms a contact on a portion of the top mirror stack 124.

The bottom mirror stack 116 and the top mirror stack 124 may be distributed Bragg reflector (DBR) stacks, and include periodic layers such as layers 132 and 134. The periodic layers 132 and 134 may be AlGaAs and AlAs, respectively, but may also be made from other III-V semiconductor materials. The top mirror stack 124 and the bottom mirror stack 116 can be doped or undoped and the doping can be n-type or p-type depending on the particular design of the VCSEL 100.

The metal contact layer 126 and any other metal contacts which may be present can be ohmic contacts that allow appropriate electrical biasing of the VCSEL 100. When the VCSEL 100 is forward biased with a voltage on metal contact layer 126 different than the other contact (not shown), the active region 122 emits light, the light passes through the top mirror stack 124 and reflects off of the metal contact layer 126. In one aspect, the light may reflect off of a metal body 150 of the metal contact layer 126. Other configurations of contacts may be used to generate a voltage across the active region 122 and generate a light or optical signal 170 that is emitted from the bottom of the substrate 114, through the diffuser 112, or both.

In its bottom emitting arrangement, the top end of the VCSEL 100 may include greater reflectivity relative to its bottom emitting end. In some aspects, the bottom mirror stack 116 may have fewer mirror periods than the top mirror stack 124. The VCSEL 100 is further configured to emit light from the substrate 114 and through the diffuser 112. As such, the diffuser 112 may be at least partially translucent or transparent to the light. In some aspects, the bottom surface of the substrate 114 may include an anti-reflective coating.

Figure 2:
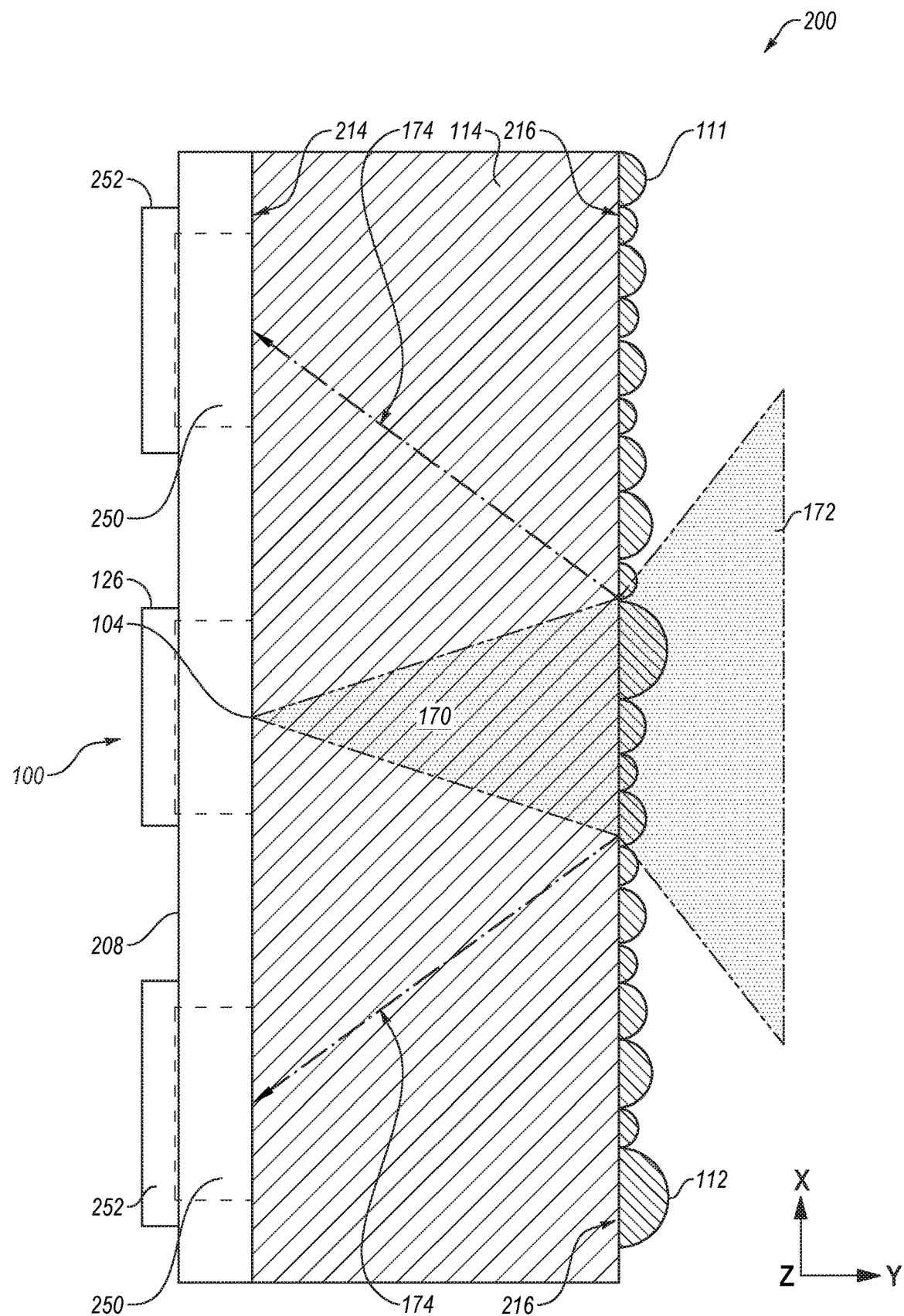
FIG. 2 is a schematic, partial section view of one embodiment of a light source including a VCSEL.

Referring now to FIG. 2, there is illustrated in section view a non-limiting configuration of a light source 200. The light source 200 includes a VCSEL 100 and a pair of monitor photodetectors 250. The monitor photodetectors 250 are positioned on a top or first surface 214 of the substrate 114 opposite of the integrated diffuser 112 which is positioned on an opposite, bottom or second surface 216 of the substrate 114. Similarly, the VCSEL 100 is associated with the monitor photodetectors 250 that are integrated with the substrate 114 which includes the VCSEL 100 and the integrated diffuser 112 in order to monitor light reflected from the diffuser 112. The diffuser 112 may be integrated at a chip-level with the substrate 114, other components of the VCSEL 100, and the monitor photodetectors 250. As illustrated, the VCSEL 100 may transmit an optical signal 170 which is directed toward and may propagate through the substrate 114; e.g., from the first surface 214 to the second surface 216.

The light source 200 includes an epitaxial layer 208 which may be formed on the first surface 214 of the substrate 114 and in which various components of the VCSEL 100 may be formed. Additionally, one or more components of the VCSEL 100, such as the metal contact layer 126 may be formed on the epitaxial layer 208. The monitor photodetectors 250 may also be formed in the epitaxial layer 208.

In some embodiments, the light source 200 may include an array of VCSELs 100. The array of VCSELs 100 may include multiple, individual VCSELs 100 that are arranged to transmit the optical signal 170. The number of VCSELs 100 may be based on a particular application for which use of the light source 200 is intended. For instance, in some embodiments, the array of VCSELs 100 may include many hundreds (e.g., one thousand or more) of the individual VCSELs. The individual VCSELs 100 may be separated by etched regions (not shown) to form mesas.

In these and other embodiments, the VCSELs 100 of the array of VCSELs may be arranged in a pattern. The pattern of the VCSELs may be repetitive or may be arranged in a pattern that is symmetric about at least one axis. For example, the VCSELs 100 in the array of VCSELs may be arranged in a rectangular pattern that is symmetric about axes that are substantially parallel to the X-axis or the Y-axis. Alternatively, in these and other embodiments, the VCSELs 100 of the array of VCSELs may be arranged in a non-repeating or non-symmetric pattern. For example, the VCSELs 100 may be arranged in a random pattern or a pseudo-random pattern.

As indicated above, the optical signal 170 is directed toward and may propagate through the substrate 114, and as it does so the dimensions of the optical signal 170 may change. For instance, in the illustrated form, a diameter or a dimension in the Y direction of the optical signal 170 may increase as the optical signal 170 propagates through the substrate 114.

The diffuser 112 may be positioned directly on the second surface 216 of the substrate 114. For example, a surface of the diffuser 112 and the second surface 216 may be in direct physical contact with one another such that the optical signal 170 propagates directly from the substrate 114 to the diffuser 112. Additionally or alternatively, the diffuser 112 may be formed such that there is no distinction between the diffuser 112 and the second surface 216 of the substrate 114. For example, in one form, the diffuser 112 may be an etched grating formed in the second surface 216 of the substrate 114. Accordingly, the optical signal 170 propagates through the diffuser 112 after the optical signal 170 exits the substrate 114 at the second surface 216.

The diffuser 112 is configured to control a particular cross-sectional profile of a beam 172 of the optical signal 170 which results after the optical signal 170 propagates through the diffuser 112. Control of the particular profile of the beam 172 may include diverging the optical signal 170 (as shown), converging the optical signal 170, collimating the optical signal 170, or some combinations thereof. Additionally, control of the particular profile of the beam 172 may include control in two axes. For example, the particular profile of the beam 172 may be controlled such that the particular profile includes a first dimension in a first direction that is aligned with a first of the two axes (e.g., the first direction may be parallel with the Y-axis) and a second dimension in a second direction that is aligned with a second of the two axes (e.g., the second direction may be parallel to the Z-axis). The control may also result in any cross-sectional shape ranging from circular shapes to polygonal shapes, or random or abstract shapes as desired, just to provide a few non-limiting examples.

The substrate 114 may be comprised of various materials or combination of materials. The material(s) of the substrate 114 may dictate or may be selected to accommodate a wavelength of the optical signal 170. For example, in some embodiments, the substrate 114 may be comprised of gallium arsenide (GaAs). A GaAs substrate may be suitable in embodiments in which the optical signal 170 has a wavelength within the infrared (IR) spectrum such as a wavelength greater than about 900 nanometers (nm) (e.g., about 940 nm as an example). In other embodiments, the substrate 114 may be comprised of indium phosphide. In these and other embodiments, the wavelength of the optical signal 170 may be longer than the wavelengths of embodiments using GaAs substrates. In yet other embodiments, the substrate 114 may be comprised of gallium nitride, silicon carbide, or sapphire. In these and other embodiments, the optical signal 170 may have a wavelength that may be in a blue spectrum. In yet other embodiments, the optical signal 170 may have a wavelength of about 1300 nm. In one aspect, the beam 172 may have the same wavelength as the optical signal 170. The substrate 114 is configured to be transparent to the wavelength range of the optical signal 170.

In the form shown in FIG. 2, the diffuser 112 includes lenslets 111, only a few of which have been identified to preserve clarity. The lenslets 111 as illustrated are spherical, but other shapes are also contemplated. The lenslets 111 are configured to provide the particular profile of the beam 172 after the diffuser 112. For example, one or more characteristics of the lenslets 111 and the arrangement of the lenslets 111 can be selected to provide a particular profile of the beam 172. One or more of the lenslets 111 may be refractive, and one or more of the lenslets 111 may be diffractive. In some embodiments, the lenslets 111 may be positioned at random or pseudorandom locations on the second surface 216 of the substrate 114. Additionally or alternatively, the lenslets 111 may include two or more focal lengths which may be randomly or pseudo-randomly determined. For example, the lenslets 111 may include five individual lenslets or other integer of individual lenslets 111, each of which may have a different focal length.

Figure 3:
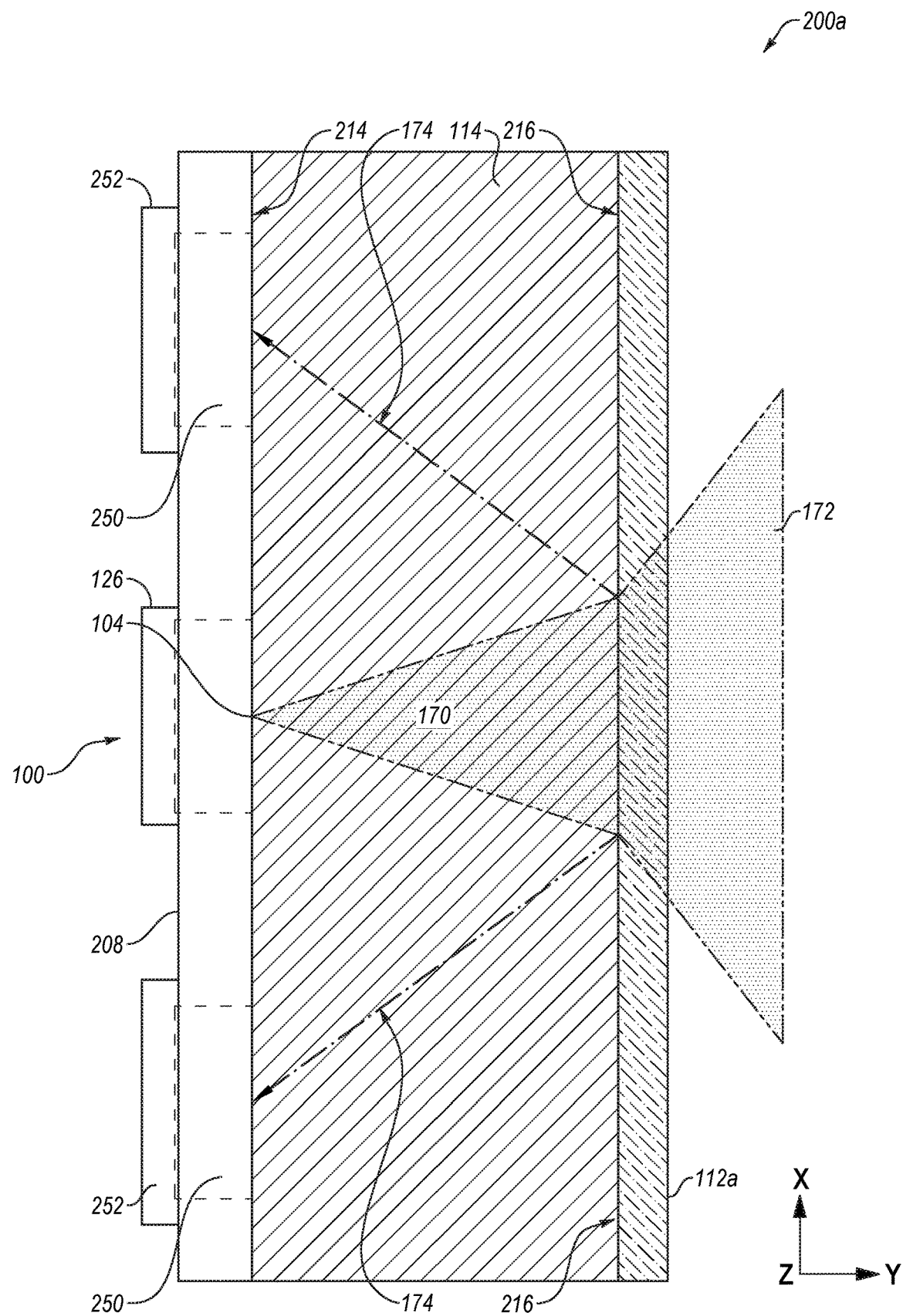
FIG. 3 is a schematic, partial section view of an alternative embodiment of a light source including a VCSEL.

Other forms for diffuser 112 are also possible as suggested above. For example, as shown in FIG. 3, where like numerals refer to like features previously described, a light source 200a includes a diffuser 112a that is formed by an etched grating integrated in the substrate 114. As such, the diffuser 112a can be directly etched into the substrate 114 or etched into a layer (e.g., an epitaxial layer) formed on the substrate 114. The diffuser 112a can include etched gratings of randomly mixed grating pitch and orientation, ordered grating pitch and orientation, or other types of etched gratings. The features of the diffuser 112a may be positioned on the second surface 216 of the substrate 114 randomly or pseudo-randomly.

The particular pattern of the features of the diffuser 112 or 112a may be repetitive or otherwise configured such that the VCSEL 100 need not be precisely aligned with the diffuser 112 or 112a. For example, in some VCSELs 100, a point of light emission 104 or region of light emission may be precisely aligned with a diffuser so the diffuser may modify or focus light passing therethrough. Misalignment between the point of light emission 104 and the diffuser may result in the light being poorly focused. However, where the diffuser 112 or 112a has multiple different characteristics, the point of light emission 104 may not need to be precisely aligned therewith. For instance, in embodiments in which the diffuser 112 or 112a includes features which are randomly or pseudo-randomly positioned and have random or pseudo-random focal lengths may enable an imprecise alignment between the point of light emission 104 and the diffuser 112.

While a majority of the optical signal 170 may emit through the diffuser 112 or 112a, some part of the optical signal 170 may be reflected back from the diffuser 112 or 112a through the substrate 114 as reflected light 174 (e.g., as a reflected optical signal) toward the monitor photodetectors 250. The reflected light 174 may be received by the monitor photodetectors 250 which in turn provide an electric signal indicative of the reflected light 174. Analysis of the electric signal provided by the monitor photodetectors can determine if the diffuser 112 or 112a is operational (e.g., intact, positioned, and functioning properly). The operational methods that analyze the electric signal of the reflected light 174 can provide an alert, such as an audio or visual alert, when it is determined that the diffuser 112 or 112a has an issue like being damaged or contaminated, or not functioning properly.

The monitor photodetectors 250 allow for real-time monitoring of the high diffraction order of the reflected light 174 from the backside of the diffuser 112 or 112a. The monitor photodetectors 250 can be operated by using reverse bias at the front side of the epitaxial material, which will allow for automatic power control, and power shutdown of the VCSEL 100 for eye safety when there is failure of the diffuser 112 or 112a.

The monitor photodetectors 250 may be any of a variety of different types of photodetectors, such as photoemission, photoelectric, thermal, polarization, or photochemical types of photodetectors. The monitor photodetectors 250 may sense light or other electromagnetic radiation, such as light having the wavelengths for the VCSELs 100 described herein. In one form, the monitor photodetectors 250 may be configured with a p-n junction that converts light photons into electrical current. In some aspects, the absorbed photons of the reflected light 174 can make electron-hole pairs in a depletion region for the electrical current. In one aspect, the monitor photodetectors 250 are configured with a semiconductor epitaxial structure substantially similar or the same as the VCSEL 100, but having a reverse bias applied thereto. As such, a monitor contact 252 may be associated with each of the monitor photodetectors 250. The monitor photodetectors 250 may also have other configurations that are known for monitor photodetectors such that they are epitaxially different from the VCSEL 100. However, it should be recognized that having the monitor photodetectors 250 having the same epitaxial structure as the VCSEL 100, and separated from the VCSEL 100 (e.g., both as mesas with gaps therebetween), may simplify manufacturing processes. In one aspect, an etching protocol can be performed during a manufacturing process to form the VCSEL 100 and the monitor photodetectors 250 as mesas.

While the light sources 200 and 200a are illustrated with one VCSEL 100 positioned between the monitor photodetectors 250, an array of VCSELs 100, with any number of columns, rows, or distribution, may be located between the two monitor photodetectors 250. Additionally or alternatively, while the light sources 200 and 200a each include a pair of monitor photodetectors 250, forms are possible in which a single monitor photodetector 250 is present or more than two monitor photodetectors 250 are present. In one form, the VCSELs 100 and the monitor photodetectors 250 may be monolithically integrated with the substrate 114.

A device having the VCSEL 100 or operational circuitry, chips, or other components of the device can be used to analyze the current generated by the monitor photodetectors 250. The monitor photodetectors 250 generate a photo current of the reflected higher diffraction order beams from the diffuser 112 or 112a.

In one aspect, the diffuser 112 or 112a may generate multiple higher order reflection beams (e.g., reflected light 174) back to the front side of VCSEL wafers to the monitor photodetectors 250. The monitor photodetectors 250 may be reversely biased for power monitoring of the reflected light 174. As the high diffraction order reflection may be highly sensitive to the structure of the diffuser 112 or 112a, monitoring the average of multiple high diffraction order beams of the reflected light 174 with the monitor photodetectors 250 can provide the electrical current having monitor data regarding power output level, power diffusion effectiveness, or other information for analysis. The placement of the monitor photodetectors 250 can be optimized based on the design of the diffuser 112 of 112a relative to the VCSEL 100.

The monitor photodetectors 250 may collect back reflected light from the diffuser interface on the other side of the substrate 114 in order to monitor the light passing through the diffuser 112 or 112a. The monitor photodetectors 250 allow for constant real-time monitoring of the reflected light 174 so that a historical record of reflected light can be recorded, which historical record of reflected light is indicative of the optical signal 170 emitted from the diffuser 112 or 112a. If the reflected light 174 which is detected by the monitor photodetectors 250 indicates a change in an optical characteristic or property, such as a reduction of intensity, the electrical signals from the monitor photodetectors 250 will change so that operation of the light source 200 or 200a may be modulated to accommodate the change. If for example the reflected light 174 falls below an operational threshold, the VCSEL 100 may be turned off, or if an array of VCSELs are present, one or more of the VCSELs 100 responsible for the change in property may be turned off. In some instances, the diffuser 112 or 112a may degrade or become unusable, which may result in turning off the VCSEL 100 or array of VCSELs 100. In one form, the monitor photodetectors 250 may provide a control signal to a diver circuit that controls operations of the VCSEL 100 or array of VCSELs 100 to alter operation of the VCSEL(s) 100 dependent on the sensing conducted by the monitor photodetectors 250.

Amongst other things, the designs disclosed herein provide the ability to monitor the functionality of the VCSEL(s) 100 as well as the integrity of the diffuser 112 or 112a. The designs disclosed herein may also provide higher reliability with respect to the integrated diffuser 112 or 112a compared to remotely placed (e.g., off chip) diffusers, along with the ability to monitor back reflection from the diffuser 112 or 112a in order to assess the functional integrity of the diffuser 112 or 112a, ranging from damage to the diffuser 112 or 112a, decoupling or delamination of the diffuser 112 or 112a from the substrate 114, contamination of the diffuser 112 or 112a, or other issues. The monitoring can be performed in real time so that any change to the functionality of the diffuser 112 or 112a, identified by a change in back reflection sensed by the monitor photodetectors 250, may be readily addressed by changing one or more operational parameters.

While not previously mentioned, damaged or improperly functioning diffusers can compromise eye safety. As such, the ability to monitor the integrity of the diffuser 112 or 112a allows use of the VCSEL 100 or VCSELs 100 to be discontinued to prevent optical leakage (e.g., errant laser light) and potential eye damage.

Figure 4A:
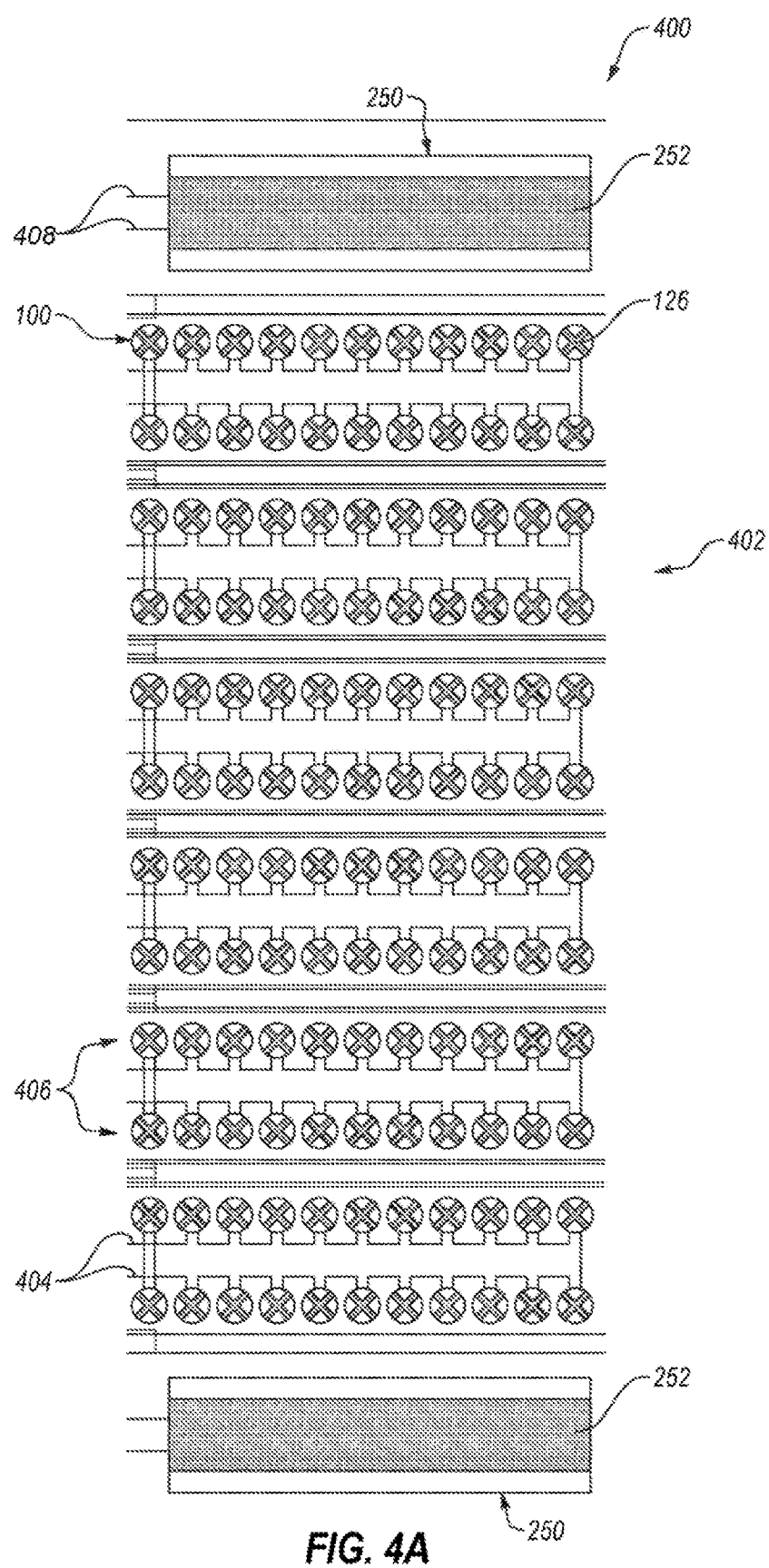
FIG. 4A is a schematic, plan view of another alternative embodiment of a light source including an array of VCSELs.

Turning now to FIG. 4A, there is illustrated in top view a light source 400 that includes a plurality of VCSELs 100 arranged in a VCSEL array 402 of adjacent rows 406 (e.g., 12 rows of 11 VCSELs) between two monitor photodetectors 250. The illustrated view shows the metal contact layer 126 and the monitor contacts 252, with the epitaxial structure positioned thereunder. The VCSELs 100 are arranged as mesas extending from the first surface 214 of the substrate 114 with gaps therebetween. The metal contact layers 126 are electrically coupled to electrical lines 404 that are arranged between adjacent VCSEL rows 406. The monitor contacts 252 are also electrically coupled to electrical lines 408. A power source and power conduction system (not shown) including the electrical lines 404 and 408 can be included to power the VCSELs 100 and the monitor photodetectors 250.

Figure 4B:
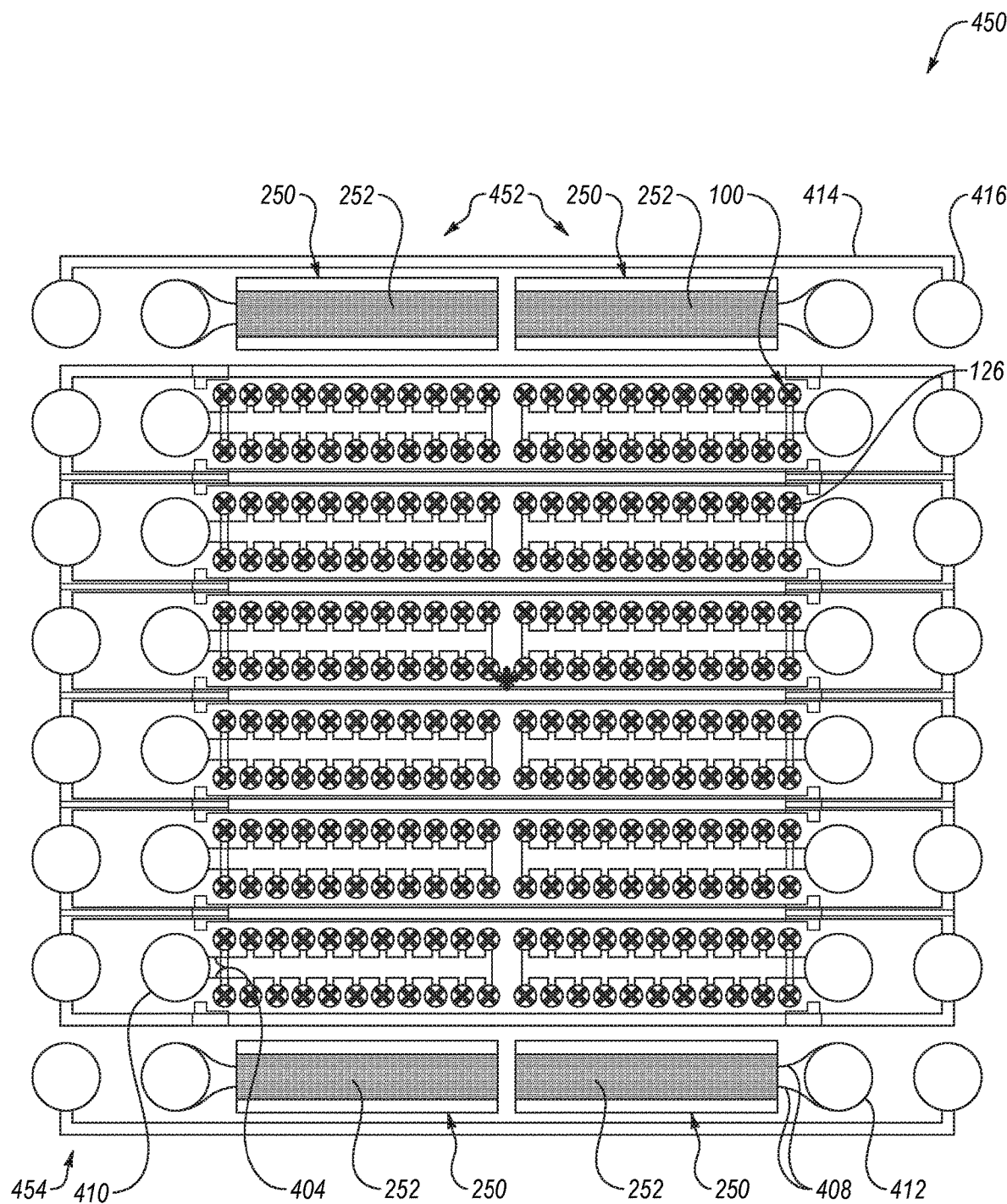
FIG. 4B is a schematic, plan view of another alternative embodiment of a light source including an array of VCSELs.

FIG. 4B illustrates a top view of a light source 450 having a VCSEL array 452 arranged between four monitor photodetectors 250. The electrical lines 404 are electrically coupled to electrical posts 410, and the electrical lines 408 are electrically coupled with electrical posts 412. A power conduction system 454 can include the electrical lines 404 and electrical posts 410 separate from electrical lines 408 and electrical posts 412. The power conduction system 454 can also include a corresponding set of electrical lines 414 and posts 416 that are separate from both the electrical lines 404 and electrical posts 410 and the electrical lines 408 and electrical posts 412. The power conduction system 454 allows for individually operating the VCSELs 100 and the monitor photodetectors 250. As can be seen, each pair of adjacent VCSEL rows 406 may be operated independent of other pairs of adjacent VCSEL rows 406. The monitor photodetectors 250 may also be operated independently of each other.

The monitor photodetectors 250 can have a width (short side) and length (long side) that is suitable for the VCSEL array 452 for monitoring back reflected light. As shown, the width of the monitor photodetectors 250 is about the same as the short dimension across two adjacent VCSEL rows 406 with the electrical lines 404 therebetween. The length of the monitor photodetectors 250 is about the same as the long dimension for the two adjacent VCSEL rows 406. However, other dimensions and shapes as well as arrangements for the components may be used.

Figure 5:
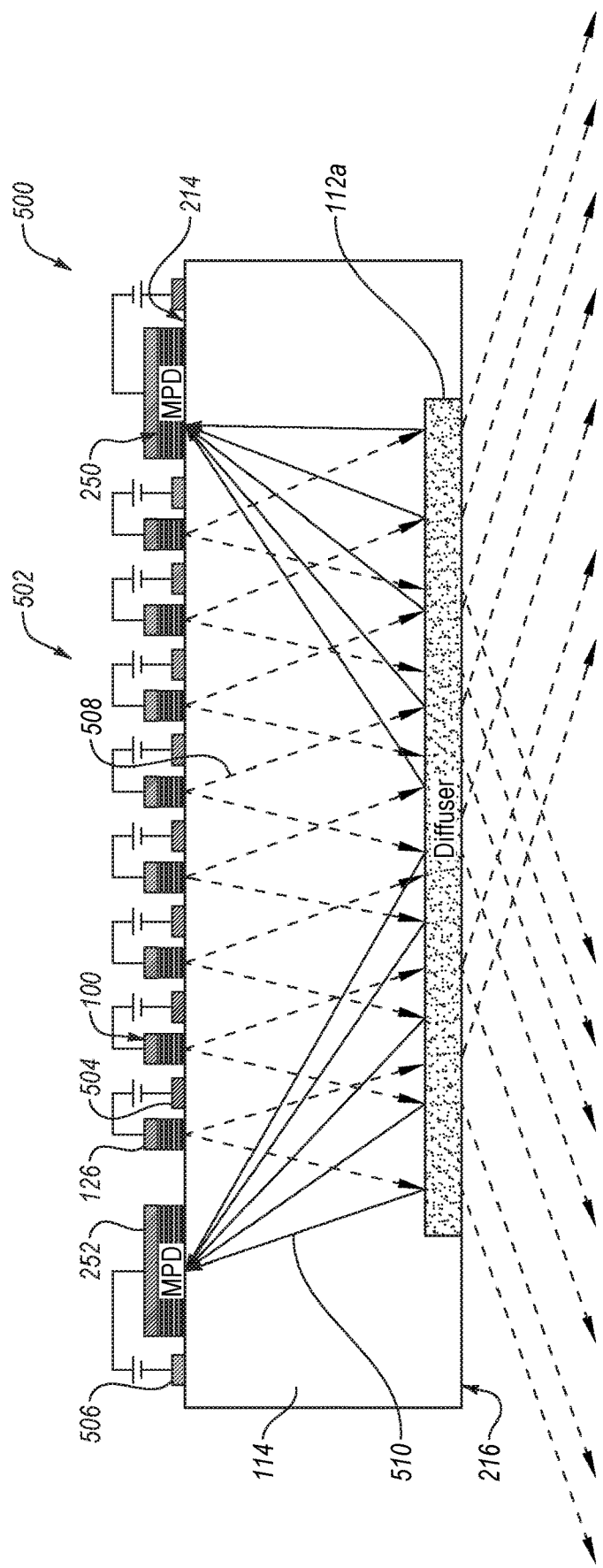
FIGS. 5 and 6 are section views illustrating different operating aspects of a light source including an array of VCSELs.

FIG. 5 illustrates a cross-sectional side view of a light source 500 having a VCSEL array 502 between a pair of monitor photodetectors 250. Each VCSEL 100 is shown to have the metal contact layer 126 in a circuit with a counter contact 504. Also, each monitor photodetector 250 is shown to have the monitor contact 252 in a circuit with a counter contact 506. Power can be applied appropriately for operation of the VCSELs 100 and monitor photodetectors 250.

The light emitted from the VCSELs 100 is shown by the dashed line arrows 508 through the substrate 114 to the diffuser 112a, and then being emitted from the diffuser 112a. The back reflected light is shown by the solid arrows 510 from the diffuser 112 to the monitor photodetectors 250. The monitor photodetectors 250 receive a reflected light signature of the summation of the rays of reflected light, which provides a steady state metric (e.g., value or range of suitable values) that can be monitored. Any change in the steady state metric can provide an indication that there is a problem that needs to be solved, such as turning off all or part the VCSEL array 502.

Figure 6:
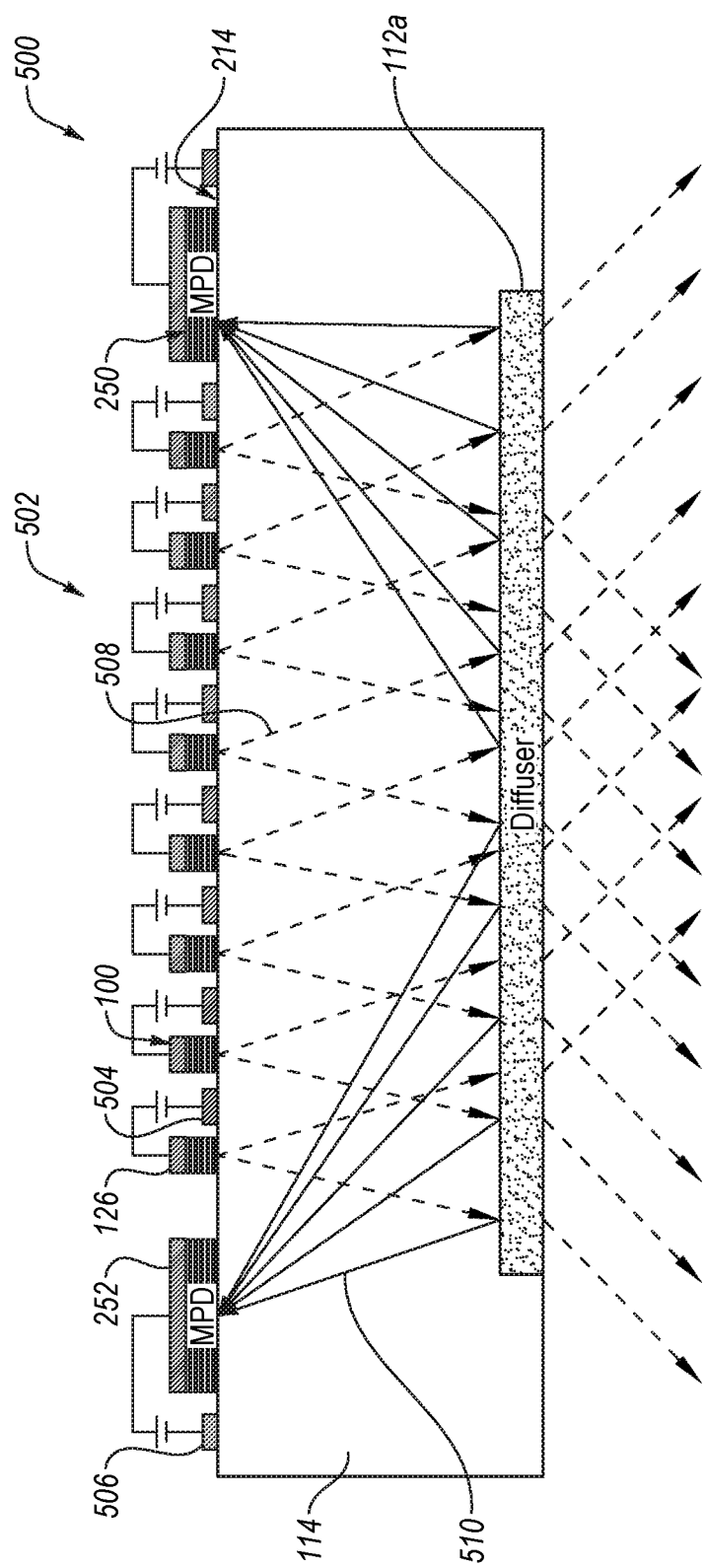

During normal operation, the diffuser 112a can widen the field of view of the light emitted therefrom. At the same time, the higher order reflection beams from the pattern of the diffuser 112a reflect back to the monitor photodetectors 250 for collection and measurement. The monitor photodetectors 250 provide the feedback signal to an automatic power control (APC) of the light source 500. The APC can be configured so that the integrated monitor photodetectors 250 monitor for constant power or operation of the light source 500 in a constant power mode. When there is a malfunction of diffuser 112a or other malfunction (e.g., a VCSEL malfunction) as shown in FIG. 6 (where like numerals refer to like features previously described), there is a change in the back reflection to the monitor photodetectors 250 so that there is a corresponding change in the feedback signal provided to the APC. The APC can then determine, such as with a microprocessor, the course of action. The course of action can range from turning off power to the entire VCSEL array 502, or selectively probing each VCSEL or VCSEL row to determine the source of the problem, or whether the problem is at the diffuser level or the VCSEL level. In some aspects, the APC can shut off the VCSEL array 502 for laser safety concerns.

While the forms of the light sources shown herein include the monitor photodetectors positioned laterally outside of the VCSEL or VCSEL array, the monitor photodetectors can be in any lateral arrangement outside the VCSEL or VCSEL array, within the VCSEL array, or a combination thereof.

The VCSEL 100, array of VCSELs 100, and light sources 200, 200a, 400, 450 and 500 may be prepared by a manufacturing process that may include forming the substrate and epitaxial layer, etching the epitaxial layer to form the VCSEL mesas and monitor photodetector mesas, forming the electrical power conduction system, forming VCSEL circuits and monitor circuits, and forming the diffuser on the substrate opposite of the VCSELs and monitor photodetectors.

The manufacturing process may also include forming a substrate; growing a first mirror region having a plurality of first mirror layers having one or more indices of refraction and then (optionally) growing a first spacer region over the first mirror region. An active region may then be grown over the first spacer region (or over the first mirror when a first spacer region is not grown). An optional second spacer region if present may be grown over the active region. An isolation region may then be grown and formed over the second spacer region (or the active region when the second spacer region is not grown). The process may also include growing a second mirror region having a plurality of second mirror layers having one or more indices of refraction. The epitaxial structure is then etched to form the VCSELs in the array as mesas, and to form the monitor photodetectors as mesas. The metal layers for the VCSEL contacts and monitor contacts are formed on the VCSEL.

The active region or other portions of a VCSEL may be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for metal organic chemical vapor deposition (MOCVD) can be >(greater than) 600° C. Additionally, the VCSELs can be prepared by methods that are similar to MBE, such as GSMBE (gas source MBE) and MOMBE (metalorganic MBE), just to provide a few examples.

In some embodiments, when the substrate 114 includes diffuser 112a, it can be etched at any time within the protocol to form the diffuser 112a. In forms where the substrate 114 includes the diffuser 112, the diffuser 112 may be mounted into a pre-formed recess in the substrate 114, although other variations are possible.

Figure 7:
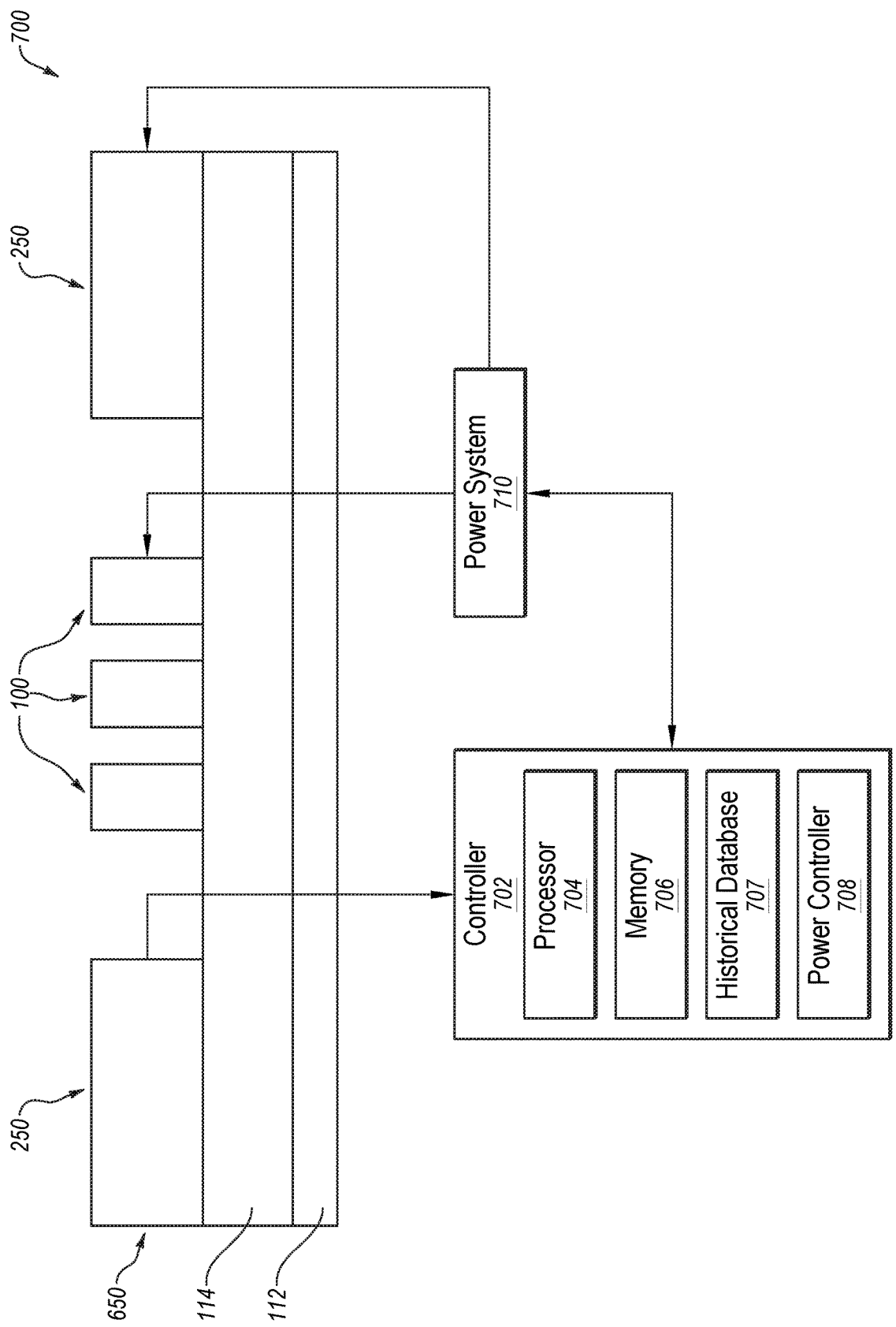
FIG. 7 is a schematic illustration of a system for operating a light source.

A schematic illustration of a system 700 for operating a light source 650 is illustrated in FIG. 7, where like numerals refer to like features previously described. While the following description is provided in connection with the light source 650, it should be understood that it may also be applicable to the other light sources 200, 200a, 400, 450 and 500 disclosed herein. In the system 700, the light source 650 includes an array of VCSELs 100, two monitor photodetectors 250, and the diffuser 112 integrated with the substrate 114 such as in one of the embodiments provided herein. During operation of the light source 650, the monitor photodetectors 250 may measure light that is emitted from the VCSELs 100 through the substrate 114 and back reflected from the diffuser 112. If a change is detected in the back reflected light, then operation of the light source 650 may be altered with a controller 702. For example, the controller 702 may provide an operation signal to the light source 650 and the monitor photodetectors 250 may provide back reflection data to the controller 702.

A processor 704 of the controller 702 may process the back reflection data (e.g., by executing a program stored in memory 706) and determine an operation level of the light source 650 based on the processed back reflection data. The operation level data may be saved as historical operation level data in a historical database 707 of the controller 702. The historical database 707 may be accessed to get historical operation level data that is compared with the back reflection data by the processor 704, such as in real time or in incremental time periods. The historical operation level data can include a maximum operational level threshold and a minimum operational level threshold, either or both of which can be defined or determined by continuously monitoring the historical operation level data and defining the thresholds based on suitable operational data.

The real time operational data can be compared to the historical data, threshold data, or both, and the difference thereof can be determined. In instances where the difference is greater than a predefined value, the controller 702 may change operation of the light source 650, and when the difference is less than a predefined value, the controller may maintain operation of the light source 650. The change in operation of the light source 650 can be implemented by changing power provided by a power system 710 to one or more of light source 650, the arrays of VCSELs 100, individual VCSELs 100, and the monitor photodetectors 250, by a power controller 708 of the controller 702.

The change in operation of the light source 650 can include completely shutting the light source 650 off, or systematically turning individual VCSELs 100 or groups of VCSELs 100 off and on to test whether any of the VCSELs 100 are functioning improperly. The light source 650 may be automatically turned off to prevent light leakage and potential damage to the eye(s) of an operator. The operator may implement a test program, which may for example reside on the memory 706, that tests each of the VCSELs 100 and determines whether or not the respective VCSEL 100 is operating within suitable levels. The operation of the light source 650 can then either be terminated or adjusted to overcome faulty operation, including inoperability, of one or some of the individual VCSELs 100. The controller 702 may for example determine that the diffuser 112 has become inoperable, contaminated, or otherwise compromised, and as a result cease operation of the light source 650.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A light source, comprising:
    a substrate including a first surface and an opposite second surface;
    an epitaxial layer positioned on the first surface of the substrate;
    a plurality of light generators arranged in a two-dimensional distribution in the epitaxial layer, the light generators arranged in at least one column in a first dimension and arranged in a plurality of rows in a second dimension, each of the light generators being positioned such that an optical signal transmitted is directed toward the substrate;
    a diffuser positioned on the second surface of the substrate; and
    at least one pair of monitor photodetectors arranged in the epitaxial layer, the monitor photodetectors in the at least one pair being arranged on both ends of the at least one column, a first of the monitor photodetectors in the at least one pair being positioned to receive a first portion of the optical signals transmitted from the light generators in the at least one column and reflected by the diffuser, a second of the monitor photodetectors in the at least one pair being positioned to receive a second portion of the optical signals transmitted from the light generators in the at least one column and reflected by the diffuser,
    wherein the light generators in each of the rows includes an array of VCSELs, each of the arrays in the rows being arranged side-by-side in the at least one column, each of the arrays being individually controllable,
    wherein the two-dimensional distribution comprises a plurality of the at least one column of the light generators arranged in the first dimension, each of the columns having the light generators arranged in the rows in the second dimension, and
    wherein the at least one pair of the monitor photodetectors comprises a plurality of the pair of monitor photodetectors, each pair arranged on both ends of a corresponding one of the columns in the first dimension.

2. The light source of claim 1, wherein the diffuser is etched directly into the second surface of the substrate.

3. The light source of claim 1, wherein the diffuser is directly coupled to the second surface of the substrate.

4. The light source of claim 3, wherein the diffuser includes one or more lenslets positioned on the second surface of the substrate.

5. The light source of claim 1, wherein the monitor photodetectors in the at least one pair are positioned at both ends of the at least one column laterally of the VCSELs in the rows.

6. The light source of claim 1, wherein operation of each of the VCSELs in the array is individually controllable.

7. The light source of claim 1, wherein each of the monitor photodetectors is configured to provide an electrical signal indicative of the reflected optical signals.

8. The light source of claim 1, further comprising a controller operably coupled with the light generators and the at least one pair of the monitor photodetectors, wherein the controller is structured to control operation of the light generators based on the reflected optical signals received by the monitor photodetectors.

9. The light source of claim 8, wherein the controller is structured to terminate operation of one or more of the light generators if a characteristic of the reflected optical signals received by at least one of the monitor photodetectors of the at least one pair deviates from a predetermined value for the characteristic.

10. The light source of claim 8, wherein a power system is operably and individually coupled with each of the light generators; and wherein the controller is structured to individually control operation of each of the light generators with the power system.

11. The light source of claim 8, wherein a power system is operably and individually coupled with each of the monitor photodetectors, and wherein the controller is structured to individually control operation of each of the monitor photodetectors with the power system.

12. The light source of claim 8, wherein in response to determining one or more of the light generators is functioning improperly based on the reflected optical signals received by at least one of the monitor photodetectors, the controller is structured to automatically terminate operation of the one or more light generators.

13. The light source of claim 1, further comprising a controller operably coupled with the light generators and the at least one pair of the monitor photodetectors, wherein the controller is structured to control operation of the light generators at least in each of the at least one column based on the reflected optical signals received by the monitor photodetectors in the pair associated with the each of the at least one column.

14. The light source of claim 13, wherein the controller monitors a steady-state metric of at least each of the columns of the light generators based on a summation of the reflected optical signals received at the monitor photodetectors in the pair associated with the each of the least one column.

15. A method of preparing a light source, comprising:
providing a substrate having a first surface and a second surface positioned opposite of the first surface;
forming an epitaxial layer on the first surface of the substrate;
forming a plurality of light generators in a two-dimensional distribution in the epitaxial layer by arranging the light generators in at least one column in a first dimension and in a plurality of rows in a second dimension and positioning each of the light generators such that an optical signal transmitted therefrom is directed toward the substrate;
forming at least one pair of monitor photodetectors in the epitaxial layer by arranging the monitor photodetectors of the pair at both ends of the at least one column; and
forming a diffuser on the second surface of the substrate such that a first of the monitor photodetectors in the at least one pair is positioned to receive a first portion of the optical signals transmitted from the light generators in the at least one column and reflected by the diffuser, and such that a second of the monitor photodetectors in the at least one pair is positioned to receive a second portion of the optical signals transmitted from the light generators in the at least one column and reflected by the diffuser,
wherein the light generators in each of the rows includes an array of VCSELs, each of the arrays in the rows being arranged side-by-side in the at least one column, each of the arrays being individually controllable,
wherein the two-dimensional distribution comprises a plurality of the at least one column of the light generators arranged in the first dimension, each of the columns having the light generators arranged in the rows in the second dimension, and
wherein the at least one pair of the monitor photodetectors comprises a plurality of the pair of monitor photodetectors, each pair arranged on both ends of a corresponding one of the columns in the first dimension.

16. The method of claim 15, wherein forming the diffuser includes directly etching the diffuser into the second surface of the substrate.

17. The method of claim 15, wherein forming the diffuser includes directly positioning the diffuser on the second surface of the substrate.

18. The method of claim 15, further comprising forming a first metal contact layer on the epitaxial layer and a second metal contact layer on the epitaxial layer.

* * * * *